(12) United States Patent
Srinivasaiah et al.

(10) Patent No.: US 6,877,121 B1
(45) Date of Patent: Apr. 5, 2005

(54) BOUNDARY SCAN CELL FOR TESTING AC COUPLED LINE USING PHASE MODULATION TECHNIQUE

(75) Inventors: Chandrasekhar Thyamagondlu Srinivasaiah, San Jose, CA (US); Udupi Harisharan, Cupertino, CA (US); Chidambaram Ramaswamy, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 464 days.

(21) Appl. No.: 09/909,658

(22) Filed: Jul. 19, 2001

(51) Int. Cl.[7] .............................................. G01R 31/28
(52) U.S. Cl. ...................................... 714/727; 714/731
(58) Field of Search ................................ 714/727, 726, 714/731

(56) References Cited

U.S. PATENT DOCUMENTS 5,444,715 A * 8/1995 Gruetzner et al. .......... 714/727
6,199,182 B1 * 3/2001 Whetsel ...................... 714/724
6,286,119 B1 * 9/2001 Wu et al. .................... 714/726
6,606,575 B2 * 8/2003 Miller ......................... 702/104

* cited by examiner

*Primary Examiner*—Albert DeCady
*Assistant Examiner*—Esaw Abraham
(74) *Attorney, Agent, or Firm*—Thelen Reid & Priest, LLP; David B. Ritchie

(57) ABSTRACT

An apparatus and a method for testing Alternating Current (AC) coupled interconnects of a circuit using boundary scan methodology are disclosed. A Boundary Scan Cell (BSC) of a transmitting Integrated Circuit (IC) generates an AC signal based on a value of the BSC of the transmitting IC and a reference clock. A Sync Pulse cell at the receiving IC generates a sync pulse signal to the BSC of the receiving IC. The BSC of the receiving IC captures a default phase of the AC signal in relation to the sync pulse signal and also captures a phase of a source of input signal. The BSC of the receiving IC then compares the phase of a source of input signal with the phase of said AC signal in relation to the phase captured at the snyc pulse signal and sends out an output signal based on the comparison.

38 Claims, 6 Drawing Sheets

BOUNDARY SCAN CELL FOR TESTING AC COUPLED LINE USING PHASE MODULATION TECHNIQUE

FIELD OF THE INVENTION

The present invention relates to boundary scan testing of interconnections between integrated circuits. More particularly, the present invention relates to AC coupled boundary scan testing.

BACKGROUND OF THE INVENTION

Electronic systems generally include at least one printed circuit board (PCB) containing one or more integrated circuit (IC) chips or ICs. ICs typically include input/output (I/O) pins which are coupled to various interconnects of the PCB. Testing performance of electronic systems which include PCBs and ICs typically requires testing at multiple levels including at the chip level, at the board level, and at the system level. Testing at the board level includes testing interconnects of the PCB. Testing at the system level requires analysis of interconnections between and among the ICs, the PCBs, and other devices both on and off the PCB.

To enhance testability at the board level as well as at the system level, a common design practice at the chip level is to incorporate boundary scan test logic into an IC in accordance with IEEE Standard 1149.1. This standard specifies the function of JTAG logic, which is named for the Joint Test Action Group, for control of boundary scan testing. Two basic elements of an IC are its core logic and its I/O pins. In accordance with IEEE Standard 1149.1, boundary scan cells (BSCs) are inserted between the core logic and the I/O pins of the IC. BSCs may be used to test the integrity of the interconnections between the plurality of ICs.

Each IC may be controlled by boundary scan logic, in accordance with IEEE Standard 1149.1, to operate either in a system mode or in a JTAG test mode. In the system mode, system data signals relating to core functions of the IC are passed through the I/O pins to and from devices external to the IC. In the JTAG test mode, test data are provided by the boundary scan chain for the purpose of testing interconnections between the IC and devices external to the IC. The boundary scan logic also provides test control signals which include mode signals, shift signals, clock signals, and update signals, among others, each of which is well known. The shift control signal instructions include a bypass instruction, a sample instruction, and a cross test instruction. The cross test instruction controls BSCs to perform a boundary scan test among the various ICs.

The IC further includes a test data input (TDI) demultiplexer, a test data output (TDO) multiplexer, a bypass register, an instruction register, an identification register, and a test access port (TAP) controller. The TDI demultiplexer includes an input coupled to receive a test data signal from the boundary scan logic which is typically external to the IC. The TDI demultiplexer includes a first output coupled to a TDI input of a first BSC of the plurality of BSCs in the IC. Each of the BSCs includes a TDI input and a TDO output. Each of BSCs is connected serially from a TDO output to a TDI input to propagate test data signals from one BSC to the next BSC in the chain. The TDI demultiplexer further includes a second output coupled to an input of the core logic, a third output coupled to an input of the bypass register; a fourth output coupled to an input of the instruction register; and a fifth output coupled to an input of the identification register.

The TDO multiplexer includes an output which is coupled to provide a test data signal to another IC or to the boundary scan logic. The TDO multiplexer further includes: a first input coupled to a TDO output of a last BSC of the plurality of BSCs in the IC, a second input coupled to an output of the core logic; a third input coupled to an output of the bypass register; a fourth input coupled to an output of the instruction register, and a fifth input coupled to an output of the identification register. The identification register includes inputs coupled to outputs of the TAP controller. The TAP controller includes inputs coupled to receive a TMS signal, a TCK signal, and a TRST signal from the boundary scan logic.

In general, there are three possible I/O structures for an IC including a two-state I/O structure, a three-state I/O structure, and a bi-directional I/O structure. Each of the three I/O structures provides coupling between the core logic and at least one I/O pin. Any or all of the I/O structures may be used in an IC depending on the particular circumstances. The two-state I/O structure includes a two-state output buffer having an input and an output. The input of the two-state output buffer is coupled to a system data output of the core logic. The output of the two-state output buffer is coupled to an I/O pin. The three-state I/O structure includes a three-state output buffer having an input, an output, and a control input. The input of the three-state output buffer is coupled to a system data output of the core logic. The output of the three-state output buffer is coupled to an I/O pin. The control input of the three-state output buffer is coupled to a three-state system control signal output line of the core logic. The bi-directional I/O structure includes a bi-directional buffer. The bi-directional buffer includes an output buffer element having an input, an output, and a control input and an input buffer element having an input and an output. The control input of the output buffer element is coupled to a bi-directional control signal output line of the core logic. The input of the output buffer element is coupled to a system data output of the core logic. The output of the input buffer element is coupled to a system data received input of the core logic. The output of the output buffer element and the input of the input buffer element are coupled together with an I/O pin.

According to conventional methods and apparatus for boundary scan testing, the BSCs are inserted into the I/O structures between the buffers and the core logic. For a two-state output structure, a BSC is inserted between the core logic and the input of the two-state output buffer. For a three-state output structure, a BSC is inserted between the system data output of the core logic and the input of the three-state output buffer. Also, a BSC is inserted between the three-state control signal output line of the core logic and the control input of the three-state output buffer. For a bi-directional output structure, a BSC is inserted between the system control signal output line of the core logic and the bi-directional output buffer. Also, a bi-directional BSC is inserted between the core logic and the bi-directional output buffer.

Turning first to FIG. 1, a detailed logic block diagram of a prior art BSC 10 is shown. The BSC 10 includes a boundary scan mode multiplexer (mode multiplexer) 12, a shift multiplexer 14, a data shift/capture register 16, and an update data register 18. The mode multiplexer 12 and the shift multiplexer 14 each have a system input (0), an update input (1), an output, and a select line. The data shift/capture register 16 and the update data register 18 each have a data input (D), a clock input (CLK), a normal output (Q), and an inverted output (Q bar or not Q).

The BSC 10 includes a system data input (SDI) line for receiving system signals including system data signals and system control signals from the system signal output lines, including the system data signal output lines and the system control signal output lines, of the core logic. If the BSC 10 is used for control purposes, the SDI line may receive a system control signal from the core logic. If the BSC 10 is used for output, the SDI line may receive a system data signal from the core logic. If the BSC 10 is used for an input, the SDI line becomes a system data received input (SDRI) line for receiving signals from the I/O pin through an input buffer. The BSC 10 also includes a system data output (SDO) line for transmitting signals through an output buffer to the I/O pin. If the BSC 10 is used for an input, the SDO line becomes a system data received output (SDRO) line for transmitting signals to the core logic. The SDI line and the SDO line complete the circuit between the core logic and the I/O structure that was bisected by the insertion of the BSC.

For control of the mode of operation by the boundary scan logic and for various test inputs from the boundary scan logic, the BSC 10 further includes a number of JTAG lines. Part or all of these lines taken collectively are sometimes referred to as forming a JTAG bus. The primary JTAG lines are a TDI line which may receive a TDI signal from the boundary scan logic either directly or via another BSC and a TDO line for providing a TDO signal to the boundary scan logic either directly or via another BSC. These two lines are common to all types of BSCs as they are used to form the chain of BSCs. The JTAG lines further include a ShiftDR signal input line, a ClockDR signal input line, an UpdateDR signal input line, and a Mode signal input line. Each line is coupled to receive the corresponding signal from the boundary scan logic. The various lines and circuit elements are coupled to one another as shown.

Turning now to FIG. 2, a detailed logic block diagram of a prior art bi-directional BSC 20 is shown. The bi-directional BSC 20 includes a bi-directional system multiplexer 22, a direction control multiplexer 24, a bi-directional shift control multiplexer 26, a bi-directional data shift/capture register 28, and a bi-directional update data register 30. The bi-directional system multiplexer 22, the direction control multiplexer 24, and the bi-directional shift control multiplexer 26 each have a system input (0), an update input (1), an output, and a select line. The bi-directional data shift/capture register 28 and the bi-directional update data register 30 each have a data input (D), a clock input (CLK), a normal output (Q), and an inverted output (Q bar or not Q).

Since the bi-directional BSC 20 serves both as an output and an input, it includes an SDI line, an SDO line, an SDRI line, and an SDRO line as described above. Similarly, the bi-directional BSC 20 includes a TDI line, a TDO line, a ShiftDR signal input line, a ClockDR signal input line, an UpdateDR signal input line, and a Mode signal input line. In addition, the bi-directional BSC 20 includes a DIRCTL signal input line. Each line is coupled to receive the corresponding signal from the boundary scan logic. The various lines and circuit elements are coupled to one another as shown.

IEEE Standard 1149.1 was first adopted in 1990. It has been widely used and has proved to be very successful. However, IEEE Standard 1149.1 does not address all situations and design practices. One such practice is the inclusion of capacitive coupling in the interconnections between ICs. A capacitor is added either to the connection between the ICs or to one, the other, or both of the I/O pins of the ICs or the PCBs with connectors. The capacitor is designed to reduce noise and block unwanted common mode voltage differences in the interconnection. For discussion, this will be referred to alternatively as either being AC coupled or DC de-coupled.

Turning now to FIG. 3, a block diagram of ten possible combinations of DC and AC coupled interconnections between two devices is shown. The choice of which of the combinations shown that are actually used depends on the circumstances. Because of the capacitor, the value of a signal at the receiving end of the interconnection is no longer the same as the value at the driving end. The result is that conventional IEEE Standard 1149.1 testing becomes impractical on AC coupled interconnections. One will note that there are seven possible AC coupled combinations where IEEE Standard 1149.1 will not work as compared to only three DC coupled combinations where IEEE Standard 1149.1 will work. As the quest for higher signal speeds continues in the future, the use of AC coupling will increase. This becomes especially true with the development of optical communication signals. The consequence will be less and less reliance on conventional IEEE Standard 1149.1 testing.

A need exists for a boundary scan testing mechanism for AC coupled interconnections that builds on the advantages of conventional IEEE Standard 1149.1 testing. Specifically, a need exists for a boundary scan testing means that is capable of detecting defects in AC coupled interconnections. Ideally, such a detection means would be simple and inexpensive. A primary purpose of the present invention is to solve these needs and provide further, related advantages.

DESCRIPTION OF THE INVENTION

An apparatus and a method for testing Alternating Current (AC) coupled interconnects of a circuit using boundary scan methodology are disclosed. A Boundary Scan Cell (BSC) of a transmitting Integrated Circuit (IC) generates an AC signal based on a value of the BSC of the transmitting IC and a reference clock. A Sync Pulse cell at the receiving IC generates a sync pulse signal to the BSC of the receiving IC. The BSC of the receiving IC captures a default phase of the AC signal in relation to the sync pulse signal and also captures a phase of a source of input signal. The BSC of the receiving IC then compares the phase of the input signal with the phase of said AC signal in relation to the phase captured at the sync pulse signal and sends out an output signal based on the comparison.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a method and apparatus for testing AC coupled interconnections. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
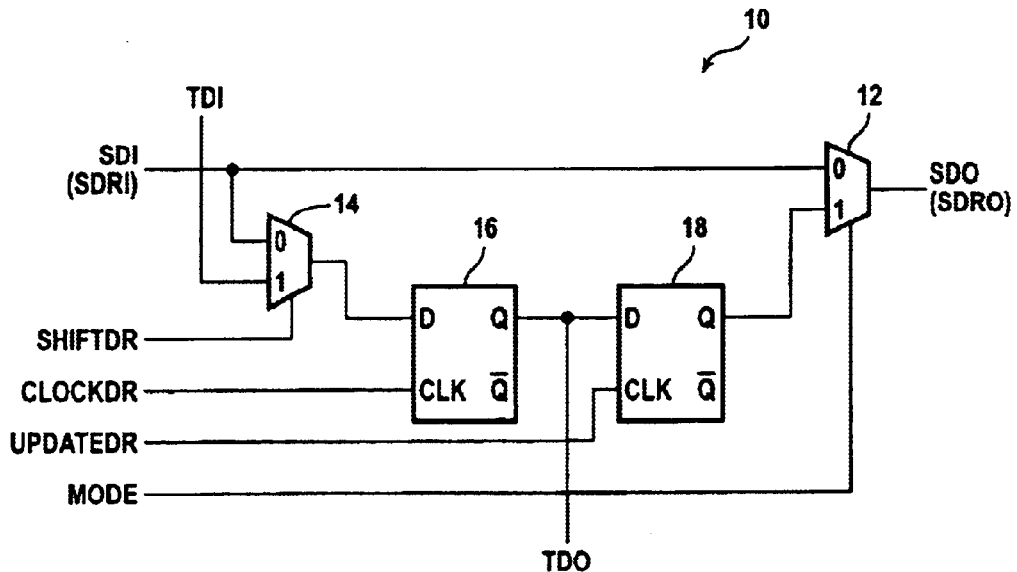
FIG. 1 is a logic block diagram of a prior art Boundary Scan Cell (BSC)
Figure 2:
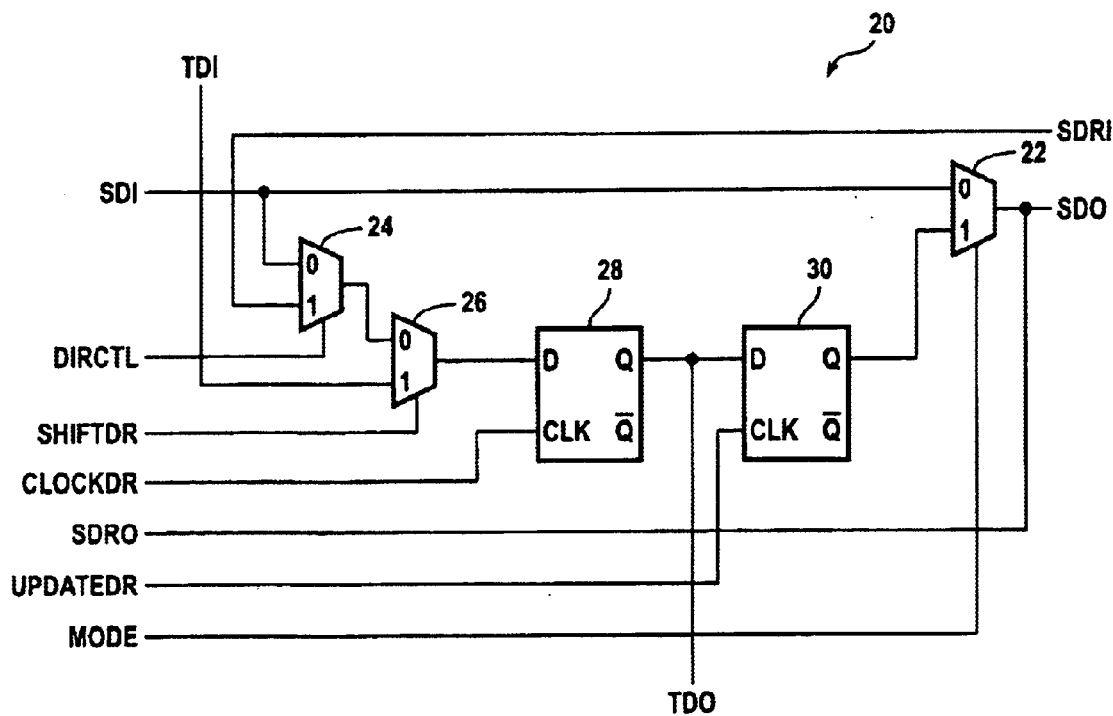
FIG. 2 is a logic block diagram of a prior art bi-directional BSC.
Figure 3:
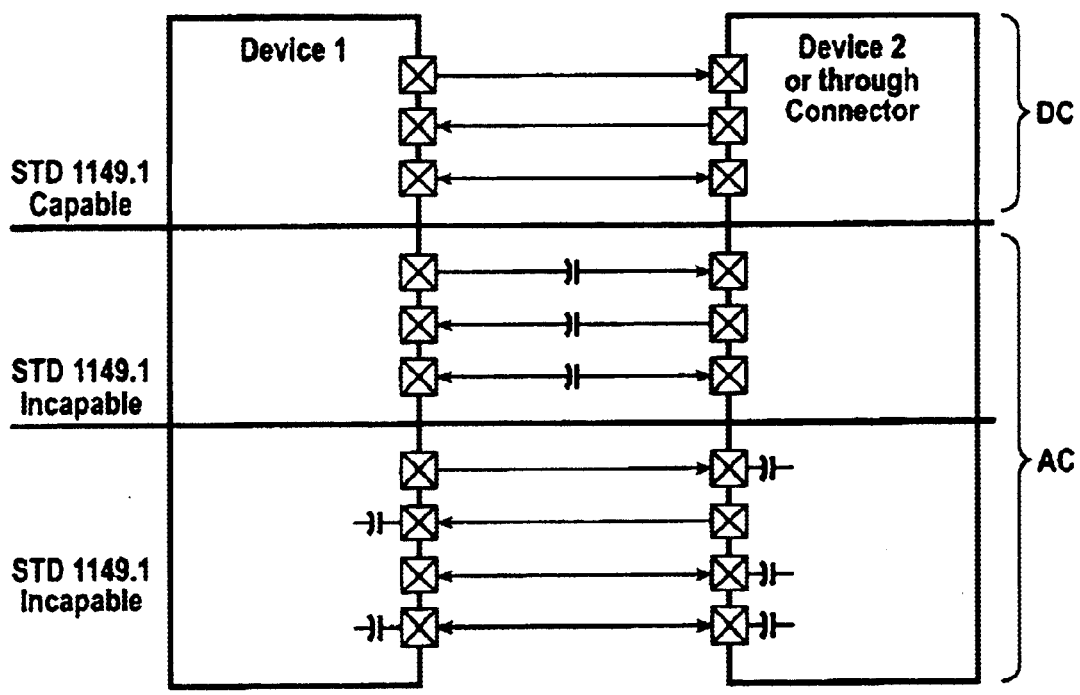
FIG. 3 is a block diagram of ten possible combinations of DC and AC coupled interconnections between two devices.
Figure 4:
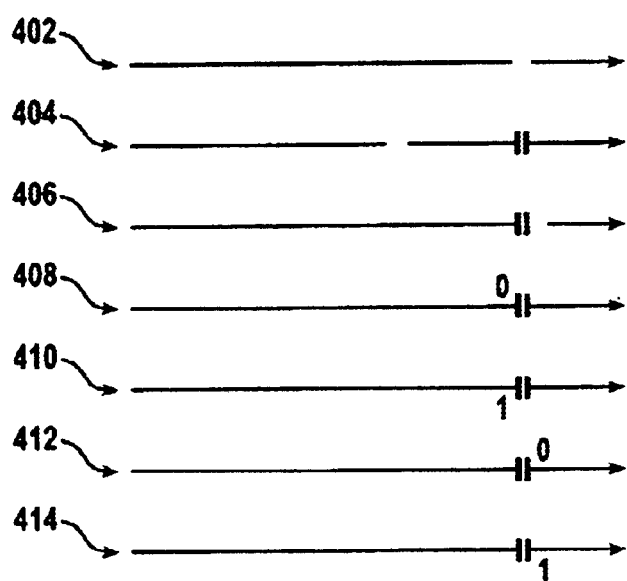
FIG. 4 is a block diagram of seven possible defects in AC coupled interconnections between two devices detectable by the presently claimed invention.

FIG. 4 is a block diagram illustrating seven possible defects in AC coupled interconnections between two devices detectable by the presently claimed invention. A first net 402 has a missing capacitor in its circuit. A second net 404 has an opening in its circuit on the driving end. A third net 406 has an opening in its circuit on the receiving end. A fourth net 408 has a driving end stuck at 0. A fifth net 410 has a driving end stuck at 1. A sixth net 412 has a receiving end stuck at 0. A seventh net 414 has a receiving end stuck at 1.

Figure 5:
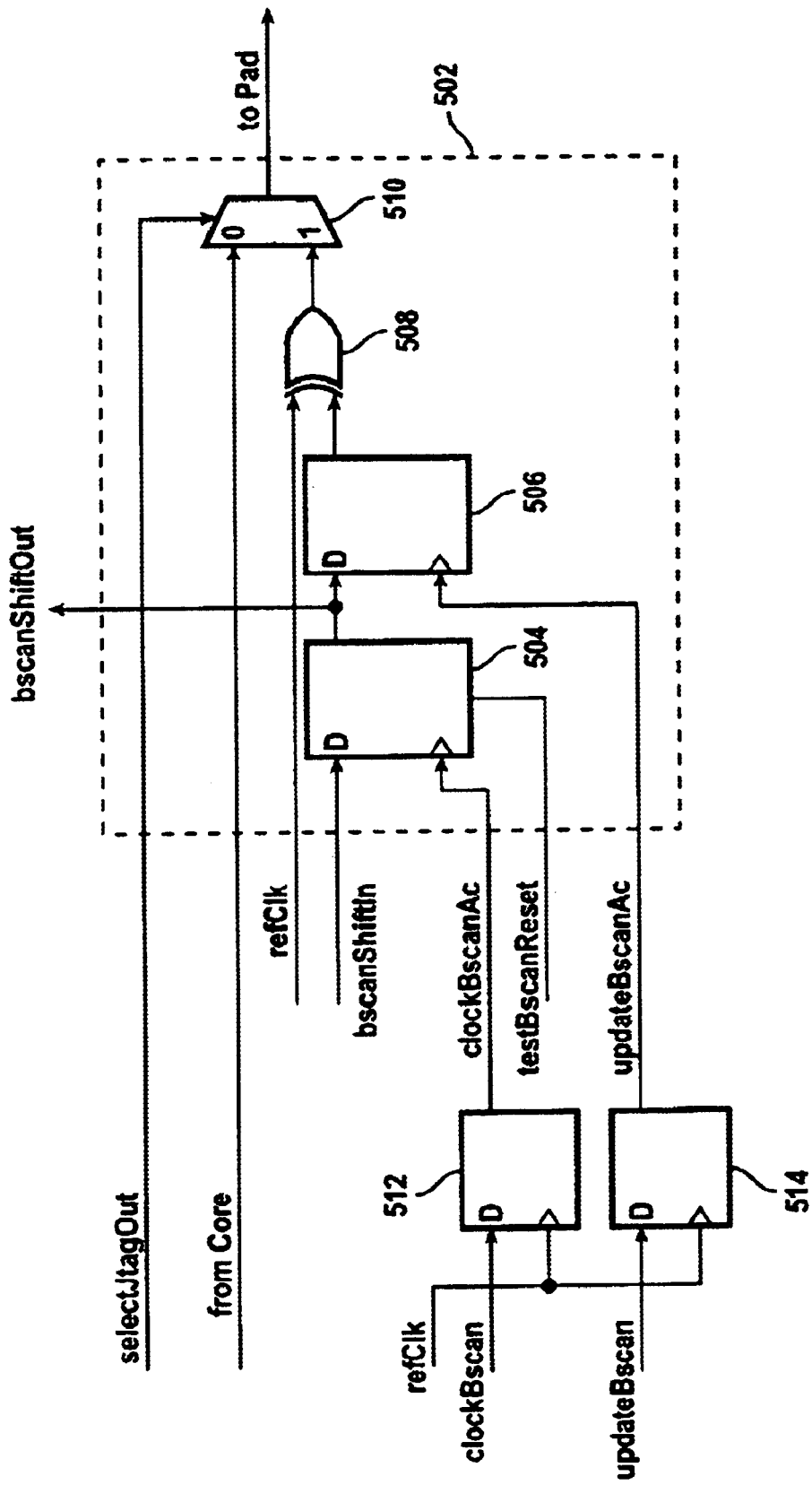
FIG. 5 is a block diagram of a transmitting Boundary Scan Cell according to a specific embodiment of the present invention.

FIG. 5 is a block diagram illustrating a transmitting boundary scan cell (BSC) according to a specific embodiment of the present invention. The circuit 502 in the box with broken lines represents a transmitter BSC according to a specific embodiment of the present invention. Such transmitter BSC is capable of acting as an ordinary boundary scan cell as well as handling AC signals.

The transmitter BSC comprises a shift/capture flip-flop 504, an update flip-flop 506, an XOR logic gate 508, and a multiplexor 510. The shift flip-flop 504 is connected to three sources of signals or data input: bscanShiftIn, clockBscanAc, and testBscanReset. The bscanshiftIn line allows AC test stimulus (control pattern) to shift in the present BSC. The clockBscanAc line is connected to the output of a flip-flop 512 that has two lines of input: clockBscan and refClk. Flip-flop 512 is generally common to all transmitting BSCS. Shift flip-flop 504 may comprise any generic D-type flip-flop. An output of shift flip-flop 504 is connected to an input of the update flip-flop 506. The output of shift flip-flop 504 is also connected to a bscanShiftOut line. The output of a flip-flop 514, having two lines of input: updateBscan and refClk, is also connected to the input of the update flip-flop 506. The shift flip-flop 504 may comprise any generic D-type flip-flop. The output of the update flip-flop 506 is connected to an input of the XOR logic gate 508. A refClk line is also connected to the input of the XOR logic gate 508. The refClk is a clock running at system speed. The output of XOR logic gate 508 is connected to an input of multiplexor 510. The multiplexor 510 is also connected to two lines: fromCore and selectJtagOut. The output of the muliplexor 510 is connected to a toPad line.

The transmitter BSC generates an AC signal which can pass through a capacitor in an AC coupled net, with attenuation less than 3 dB. This transmitter BSC changes the phase of the clock signal by 180 degrees whenever the "Update" cell data changes. With the reset, the update cell needs to have a "0" so that the receiving BSC can sync up.

The transmitter BSC 502 receives a reference clock signal from the refClk line. Based on the value in the update register, the transmitter BSC 502 generates an AC signal that is in phase with the reference clock signal or out of phase by 180 degrees with the reference clock signal. If the transmitter BSC 502 is not in AC JTAG mode, the reference clock signal input to the transmitter BSC 502 is held low thereby allowing the BSC 502 to drive the same DC pattern as is present in the Update register of the transmitter BSC 502.

In order to set the default phase once in AC JTAG mode, the transmitter BSC needs to be reset through the application of "testBscanReset" line which can be generated from a conventional Test Access Port (TAP). This ensures that the outgoing phase at test reset corresponds to a "zero" value in the boundary scan register.

Thus once in AC JTAG mode, continuous AC signals are streaming out of the transmitter BSC 502 and the phase of the AC signals changes whenever the value in the update register changes. If it is a concern for power that these oscillations be turned off except when required (that is between update and capture), this could be accomplished by additional decoding from the TAP. However, this shouldn't be an issue since the systems are designed to work as such under worst case conditions.

Figure 6:
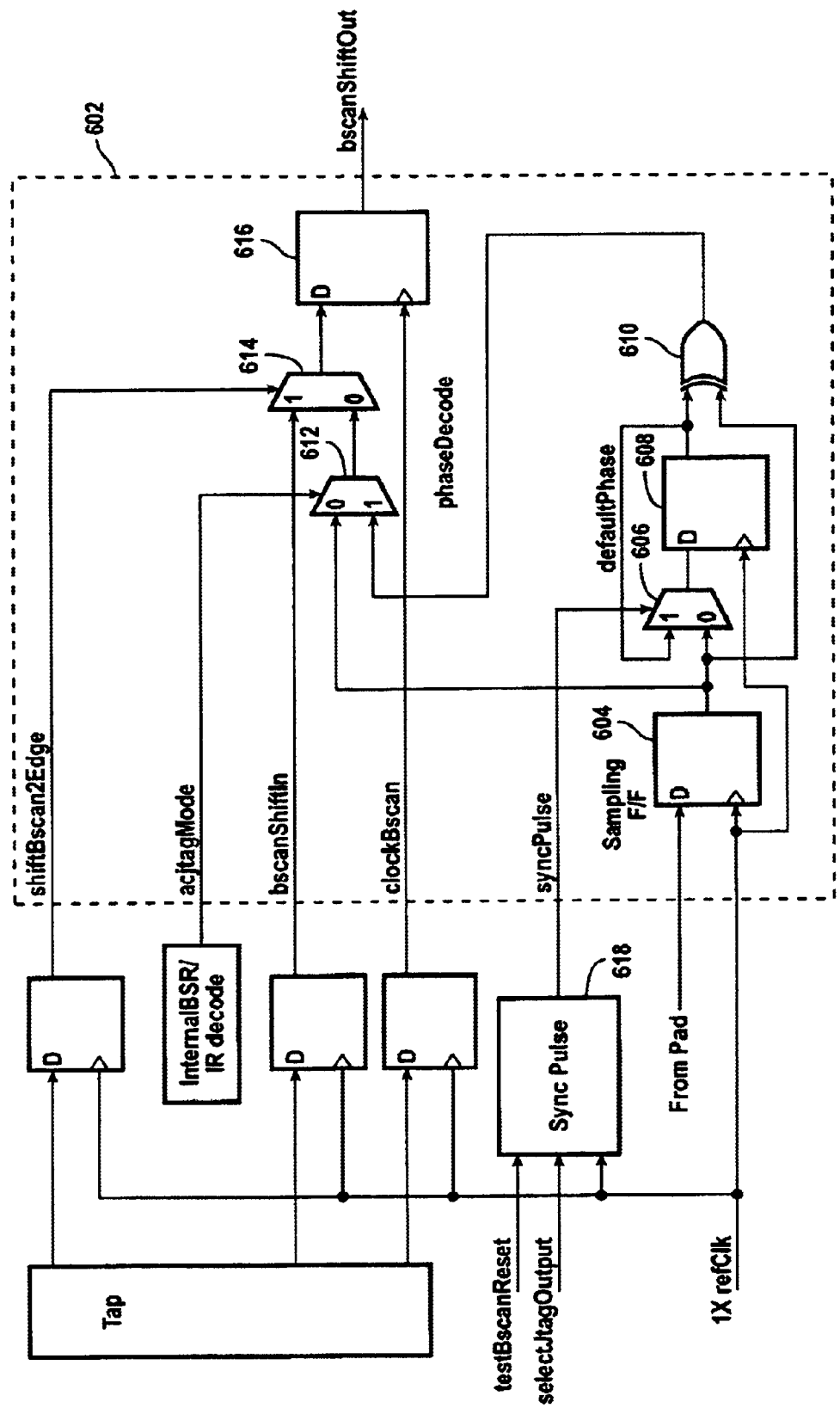
FIG. 6 is a block diagram of a receiving Boundary Scan Cell according to a specific embodiment of the present invention.

FIG. 6 is a block diagram illustrating a receiving Boundary Scan Cell (BSC) according to a specific embodiment of the present invention. The circuit 602 in the box with broken likes represents a receiving BSC according to a specific embodiment of the present invention. Such receiving BSC is capable of acting as an ordinary boundary scan cell as well as handling AC signals.

The receiving BSC 602 comprises a sampling flip-flop 604, a first multiplexor 606, a second flip-flop 608, an XOR logic gate 610, a second multiplexor 612, a third multiplexor 614, and a third flip-flop 616. The sampling flip-flop 604 is connected to two sources of input: a fromPad line and the refClk line. The sampling flip-flop 604 may comprise any generic D-type flip-flop. An output of the sampling flip-flop 604 is connected to an input of the first multiplexor 606. A syncPulse line connected a Sync Pulse cell 618 connects to select input of the first multiplexor 606. An output of the first multiplexor 606 connects to an input of the second flip-flop 608. Another input of the second flip-flop 608 is connected to the refClk line. An output of the second flip-flop 608 is connected to an input of the XOR logic gate 610. Another output of the second flip-flop 608 is feedback to another input of the first multiplexor 606. The output of the sampling flip-flop 604 is also connected to another input of the XOR logic gate 610. An output of the XOR logic gate 610 is connected to an input of the second multiplexor 612. The output of the sampling flip-flop 604 is also connected to another input of the second multiplexor 612. An acjtagMode line is connected to another input of the second multiplexor 612. An output of the second multiplexor 612 is connected to an input of the third multiplexor 614. The third multiplexor 614 has another input connected to two lines: bscanShiftIn and shiftBscan2Edge. An output of the third multiplexor 614 is connected to an input of the third flip-flop 616. Another input of the third flip-flop 616 is also connected to a clockBscan line. An output of the third flip-flop 616 is connected to a bscanShiftOut line.

The receiving BSC 602 decodes the phase of the AC signal received from the transmitting BSC 502. The receiving BSC 602 decodes the initial phase value and stores it. The initial decode value can be either "0" or "1". If it is a "1", the later decodes are inverted. Otherwise, the signals are passed as they are. The initial phase is assumed to be "0". The input of the receiving BSC 602 is sampled using D-type sampling flip-flops such as the sampling flip-flop 604, with the same clock frequency as the one generated by the transmitting BSC 502. The output of the sampling flip-flop 604 toggles whenever the phase of the input changes.

The receiving BSC 602 is based on capturing the phase of the transmitting BSC 502. That is, in order to recognize phase changes, the receiving BSC 602 has to capture the default phase (i.e. the phase when AC JTAG mode is entered and the transmitting BSC contains a zero in its Update Register). This is accomplished by generating an internal sync pulse, which is common in all receiving BSCs. The internal sync pulse is generated when the receiving BSC 602 enters the AC JTAG mode. In order to switch to AC JTAG mode, all integrated circuits under test must be in AC JTAG mode during the same instruction cycle. The sync pulse switches the "defaultPhase" flop 608 to the sampling flops' output and thus captures the default phase. Since the sync pulse is not generated again until the test is exited, this default phase remains captured.

If a "zero" is loaded, the phase corresponds to the default phase. Such default phase causes the other input of the XOR logic gate 610 to be the same as the defaultPhase resulting in a "zero" being propagated out to the capture flop 616. In a capture state while in AC JTAG mode, the capture flop 616 will capture a "zero."

If a "one" is loaded at the transmitting cell, the phase inverts from the default and the change in phase is captured by the sampling flop 604 and fed as the input to the XOR logic gate 610. The XOR logic gate 610 then changes the phase to a "one" as its default input is the inverse of the input from the sampling flop 604. Thus, the "one" updating at the transmitting BSC 502 is captured at the receiving BSC 602.

If the receiving BSC 602 needs to be in a non AC JTAG mode, it will sample the output of the pin directly instead of sampling the XOR logic gate 610 output. Thus, the legacy operation of boundary scan is duplicated.

Figure 7:
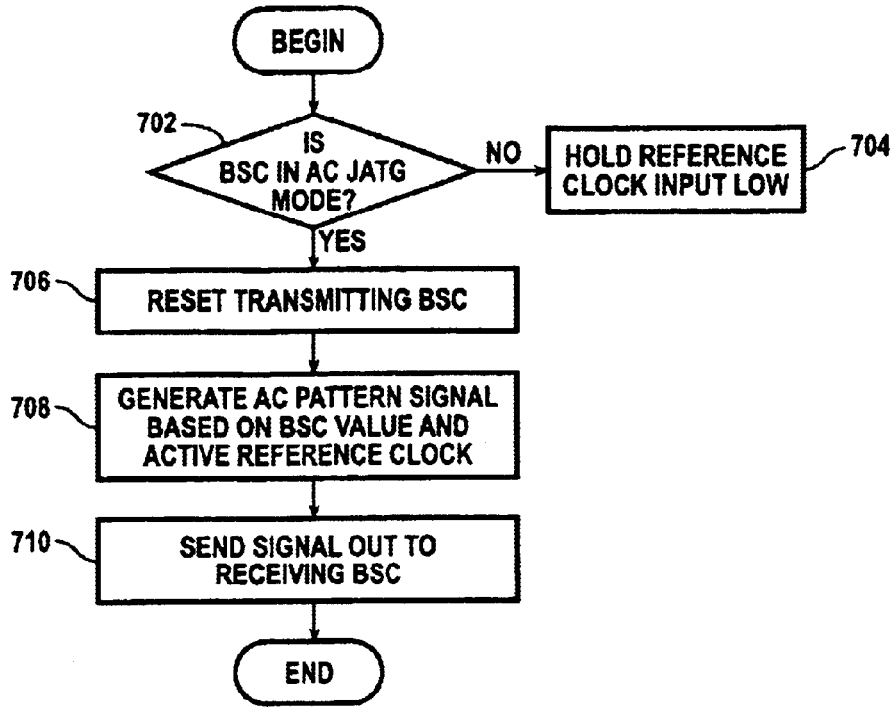
FIG. 7 is a flow diagram of a method for enabling a transmitting Boundary Scan Cell to operate with AC signals according to a specific embodiment of the present invention.
Figure 9A:
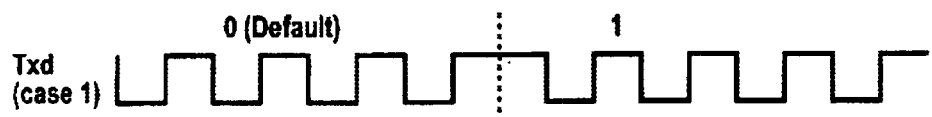
FIG. 9A is a diagram illustrating possible signals transmitted by a transmitting Boundary Scan Cell according to a specific embodiment of the present invention.
Figure 9B:
FIG. 9B is a diagram illustrating other possible signals transmitted by a transmitting Boundary Scan Cell according to a specific embodiment of the present invention.

FIG. 7 is a flow diagram illustrating a method for enabling a transmitting Boundary Scan Cell (BSC) to operate with AC signals according to a specific embodiment of the present invention. In a first block 702, the transmitting BSC 502 detects whether it is functioning in AC JTAG mode. If the transmitting BSC 502 is not in AC JTAG mode, the reference clock input line refclk to the XOR logic Rate 508 is held low in a block 704, thereby allowing the BSC to drive the same DC pattern as is present in the update register of the transmitting BSC. In block 706, if the transmitting BSC 502 is in AC JTAG mode, the transmitting BSC 502 is reset as described above. In block 708, the transmitting BSC generates AC signal based on the value of the transmitting BSC and the active reference clock as described above. The AC signal is then sent out to the receiving BSC 602 in block 710. Examples of AC signals produced by the transmitting BSC 602 are illustrated in FIGS. 9A and 9B.

Figure 8:
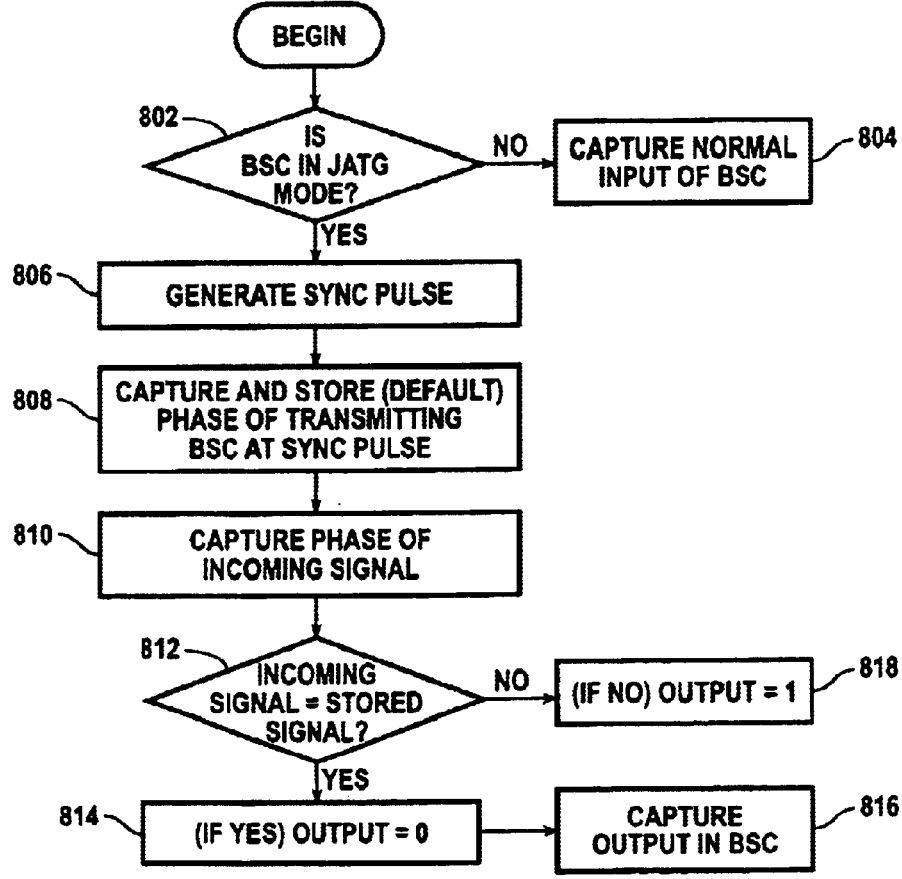
FIG. 8 is a flow diagram of a method for enabling a receiving Boundary Scan Cell to operate with AC signals according to a specific embodiment of the present invention.
Figure 10A:
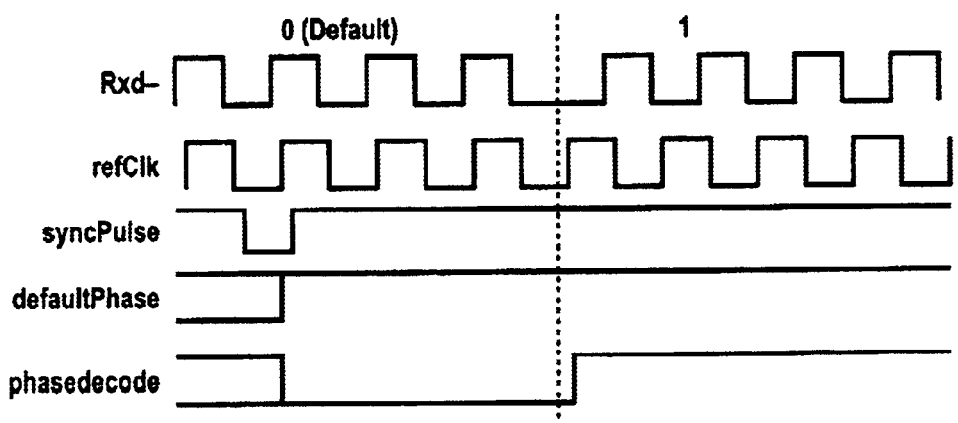
FIG. 10A is a diagram illustrating possible signals processed by a receiving Boundary Scan Cell and a Sync Pulse Cell according to a specific embodiment of the present invention.
Figure 10B:
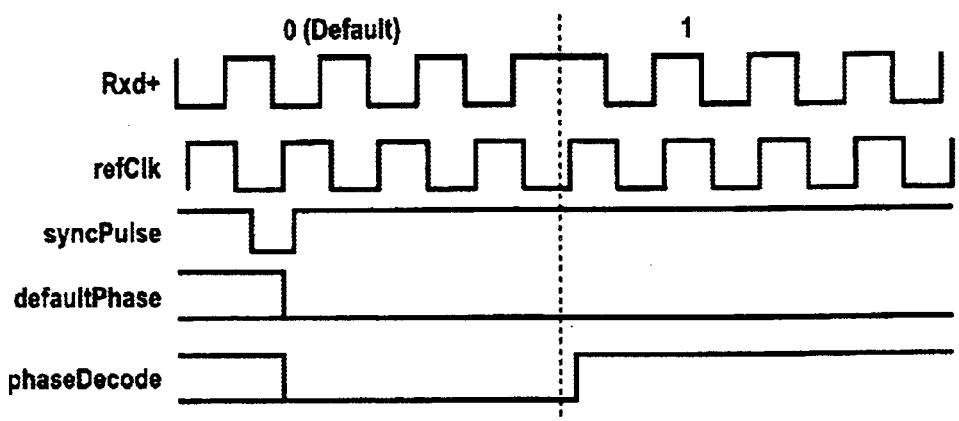
FIG. 10B is a diagram illustrating other possible signals processed by a receiving Boundary Scan Cell and a Sync Pulse Cell according to a specific embodiment of the present invention.

FIG. 8 is a flow diagram illustrating a method for enabling a receiving Boundary Scan Cell (BSC) to operate with AC signals according to a specific embodiment of the present invention. In a first block 802, the receiving BSC 602 detects whether it is functioning in AC JTAG mode. If the receiving BSC 602 is not in AC JTAG mode, the receiving BSC 602 functions as a conventional Boundary Scan Cell in a conventional 1149.1 testing in block 804. The receiving BSC 602 is capable of working like an ordinary receiving BSC or an AC JTAG cell. The principle in detecting the phase of the AC signals received is to sample it with a D-type flop-flop, such as the sampling flip-flop 604, using the clock of the same frequency and meeting the setup and hold time. Thus the output of the sampling flip-flop 604 changes where there is a change in phase of the incoming signal. This change is illustrated in FIG. 10A and FIG. 10B.

If the receiving BSC 502 is in AC JTAG mode, a Sync Pulse by the Sync Pulse Cell 618, as described above, is generated in block 806. In the AC JTAG mode, the receiving BSC 602 detects the default phase and makes the "phaseDecode" as "0". The Sync Pulse cell 618 generates a "sync_pulse" signal of 1refClk period, once we enter Ac jtag mode reset, with "selectJtagOuput" and "AcjtagMode" going high. "SelectJtagOutput" is delayed sufficiently to allow the transmitting BSC to send the AC signal so that the receiver can capture it. "SelectJagOutput" is the mode signal defined in the standard test 1149.1, which gives the pin permission in EXTEST instruction. In block 808, with this "SyncPulse," the default phase is captured and stored at "defaultPhase" signal. The flip-flop 604 driving the "phase" signal has the clock and input of the same frequency so that it captures either a one or a zero depending on the phase. In block 810, the incoming signal is also captured using the same process.

In block 812, the incoming signal and the stored signal are compared. If a "zero" is loaded at the transmitting cell, the phase corresponds to the default phase in block 814. Such default phase causes the other input of the XOR logic gate 610 to be the same as the defaultPhase resulting in a "zero" being propagated out to the capture flop 616. In a capture state while in AC JTAG mode, the capture flop 616 will capture a "zero" in block 816.

If a "one" is loaded in block 818, the phase inverts from the default and the change in phase is captured by the sampling flop 604 and fed as the input to the XOR logic gate 610. The XOR logic gate 610 then changes the phase to a "one" as its default input is the inverse of the input from the sampling flop 604. Thus, the "one" updating at the transmitting BSC 502 is captured at the receiving BSC 602 in block 816.

It should be noted that the AC signal or pattern from the transmitter BSC 502 is based on the reference clock signal fed to the transmitter BSC 502. This reference clock signal can be derived from the clock tree that would feed a source synchronous clock, which would be the sampling clock in the receiving BSC 602, and thus maintaining a definite phase relationship between the transmitted pattern and the clock sampling. This relationship is necessary just as in case of a function data signal for the scheme to work. Thus in other clocking schemes, the constant phase between transmitted and sampling clock should be maintained.

The advantages of the presently claimed invention are numerous. First, the reference clock on the board can be used. This reference clock signal goes to the integrated circuits, which have this interface. If the reference clock signal has more than 3 dB attenuation, then this clock needs to be multiplied and used in the integrated circuit. Second, there is no need for any synchronization mechanism between the transmitting BSC and the receiving BSC. And last, the reference clock is connected to the integrated circuits with this interface so that controls of skew are very easy. Thus, the BSCs as described above work as either ordinary IEEE 1149.1 or as AC JTAG cells.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted expect in the spirit of the appended claims.

What is claimed is:

1. A method for testing a circuit including AC coupled interconnects, the circuit having a transmitting IC and a receiving IC that are coupled together by an AC interconnection, each IC having a Boundary Scan Cell (BSC) connected to a reference clock, the method comprising:
    generating an AC signal based on the reference clock and a value held in the BSC of the transmitting IC, the AC signal having a first phase if a first value is held in the BSC, and a second phase if a second value is held in the BSC;
    generating, for the receiving IC, a sync pulse signal based on a test reset signal;
    capturing, in the BSC of the receiving IC, a default phase of said AC signal in response to said sync pulse signal;
    sampling a phase of the AC signal;
    comparing the default phase with the sampled phase of the AC signal; and
    generating a phase decode signal based on said comparing.

2. The method according to claim 1, wherein said generating an AC comprises:
    resetting the BSC of the transmitting IC.

3. The method-according to claim 2, wherein said resetting comprises:
    latching a default value in a boundary scan register in the BSC of the transmitting IC.

4. The method according to claim 3, wherein the default value is zero.

5. The method according to claim 1, wherein the second phase is an inverted phase of the first phase.

6. The method according to claim 1, wherein the sync pulse signal is generated based on the reset signal when a mode select signal is active high.

7. The method according to claim 1, wherein the phase decode signal has a first value if the captured phase of the AC signal matches the default phase, and a second value if the captured phase of the AC signal does not match the default phase.

8. The method according to claim 1, wherein said capturing the default phase comprising:
    capturing a signal level of the AC signal using the reference clock in response to the sync pulse signal; and
    setting the captured signal level as a default phase signal level.

9. The method according to claim 8, wherein said capturing the phase of the AC signal comprising:
    capturing a signal level of the AC signal using the reference clock.

10. The method according to claim 9, wherein the phase decode signal have a first value if the captured signal level of the AC signal has the default phase signal level, and a second value if the captured signal level of the AC signal does not have the default phase signal level.

11. A system for testing a circuit including AC coupled interconnects, the circuit having a transmitting IC and a receiving IC that are coupled together by an AC interconnection, each IC having a plurality of boundary scan cells (BSCs) connected to a reference clock, the system comprising:
    means for generating an AC signal based on the reference clock and a value held in the BSC of the transmitting IC, the AC signal having a first phase if a first value is held in the BSC, and a second phase if a second value is held in the BSC;
    means for generating a sync pulse signal based on a test reset signal;
    means for capturing, in the BSC of the receiving IC, a default phase of said AC signal in response to said sync pulse signal;
    means for sampling a phase of the AC signal;
    means for comparing the default phase with the sampled phase of the AC signal; and
    means for generating a phase decode signal based on said comparing.

12. The system according to claim 11, wherein said means for generating an AC signal comprises:
    means for resetting the BSC of the transmitting IC.

13. The system according to claim 12, wherein said means for resetting comprises:
    means for latching a default value in a boundary scan register in the BSC of the transmitting IC.

14. The system according to claim 13, wherein the default value is zero.

15. The system according to claim 11, wherein the second phase is an inverted phase of the first phase.

16. The system according to claim 11, wherein the sync pulse signal is generated based on the reset signal when a mode select signal is active high.

17. The system according to claim 11, wherein the phase decode signal has a first value if the captured phase of the AC signal matches the default phase, and a second value if the captured phase of the AC signal does not match the default phase.

18. The system according to claim 11, wherein said means for capturing the default phase comprising:
    means for capturing a signal level of the AC signal using the reference clock in response to the sync pulse signal; and means for setting the captured signal level as a default phase signal level.

19. The system according to claim 18, wherein said means for capturing the phase of the AC signal comprising:
means for capturing a signal level of the AC signal using the reference clock.

20. The system according to claim 19, wherein the phase decode signal have a first value if the captured signal level of the AC signal has the default phase signal level, and a second value if the captured signal level of the AC signal does not have the default phase signal level.

21. A program storage device readable by a machine, tangibly embodying a program of instructions readable by the machine to perform a method for testing a circuit including AC coupled interconnects, the circuit having a transmitting IC and a receiving IC that are coupled together by an AC interconnection, each IC having a Boundary Scan Cell (BSC) connected to a reference clock the method comprising:
generating an AC signal based on the reference clock and a value held in the BSC of the transmitting IC, the AC signal having a first phase if a first value is held in the BSC, and a second phase if a second value is held in the BSC;
generating, for the receiving IC, a sync pulse signal based on a test reset signal;
capturing, in the BSC of the receiving IC, a default phase of said AC signal in response to said sync pulse signal;
sampling a phase of the AC signal;
comparing the default phase with the sampled phase of the AC signal; and
generating a phase decode signal based on said comparing.

22. The program storage device according to claim 21, wherein said generating an AC signal comprises:
resetting the BSC of the transmitting IC.

23. The program storage device according to claim 22, wherein said resetting comprises:
latching a default value in a boundary scan register in the BSC of the transmitting IC.

24. The program storage device according to claim 23, wherein the default value is zero.

25. The program storage device according to claim 21, wherein the second phase is an inverted phase of the first phase.

26. The program storage device according to claim 21, wherein the sync pulse signal is generated based on the reset signal when a mode select signal is active high.

27. The program storage device according to claim 21, wherein the phase decode signal has a first value if the captured phase of the AC signal matches the default phase, and a second value if the captured phase of the AC signal does not match the default phase.

28. The program storage device according to claim 21, wherein said capturing the default phase comprising:
capturing a signal level of the AC signal using the reference clock in response to the sync pulse signal; and
setting the captured signal level as a default phase signal level.

29. The program storage device according to claim 28, wherein said capturing the phase of the AC signal comprising:
capturing a signal level of the AC signal using the reference clock.

30. The program storage device according to claim 29, wherein the phase decode signal have a first value if the captured signal level of the AC signal has the default phase signal level, and a second value if the captured signal level of the AC signal does not have the default phase signal level.

31. An output AC boundary scan cell (BSC), comprising:
a first flip-flop having a data input connected to a bscanShiftIn line, a clock input connected to a clockBscanAc line, a test reset input connected to a testBscanAc line, and an output connected to a bscanShiftOut line;
a second flip-flop having a data input connected to said output of said first flip-flop, an update input connected to a updateBscanAc line, and a second flip-flop output;
an XOR logic gate having a first input connected to a refClk line, a second input connected to said second flip-flop output, and an XOR logic gate output said XOR logic gate is adapted to output an AC signal, the AC signal having a first phase if a first value is held in said second flip-flop holds, the AC signal having a second phase if a second value is held in said second flip-flop; and
a multiplexer having a first input connected to a fromCore line, a select input connected to a selectJtagOut line, a second input connected to said XOR logic gate output, and a multiplexor output, said multiplexer selectively outputting a signal from the second input if a mode signal on the selctJtagOut line indicates an AC JTAG mode.

32. The output AC boundary scan cell according to claim 31, wherein said multiplexer outputs a DC test data input signal from the fromCore line if the mode signal on the selctJtagOut line indicates non-AC JTAG mode.

33. An output AC boundary scan cell (BSC) for generating a signal, said output AC BSC comprising:
a first flip-flop for receiving and capturing a shift-in test data;
a second flip-flop connected to said first flip-flop for holding and updating a value of the shift-in test data;
an XOR logic gate connected to said second flip-flop for generating an AC signal based on a reference clock signal and the value held in said second flip-flop, the AC signal having a first phase if a first value is held in said second flip-flop, and having a second phase if a second value is held in said second flip-flop; and
a multiplexor for selectively outputting the AC signal based on a mode signal.

34. The output AC boundary scan cell according to claim 33, wherein said multiplexer outputs a DC test data input signal supplied from a first input if the mode signal indicates a non-AC JTAG mode, and outputs the AC signal supplied from a second input if the mode signal indicates the AC JTAG mode.

35. An input AC boundary scan cell (BSC), comprising:
a first flip-flop having a data input for receiving an input signal, a clock input connected to a refClk line, and a first flip-flop output, the input signal being an AC signal if said BSC is in an AC JTAG mode and a DC signal if said BSC is a non-AC JTAG mode, the first flip-flop output indicating a captured phase of the AC signal if the input signal is the AC signal;
a first multiplexer having a first input, a select input connected to a syncPulse line, a second input connected to said first flip-flop output, and a first multiplexer output, a sync pulse signal on the syncPulse line having an initial pulse;

a second flip-flop having a data input connected to said first multiplexer output, a clock input connected to a refclk line, and a second flip-flop output feedback to said first input of said first multiplexer, said second flip-flop adapted to capture a default phase of the AC signal in the AC-JTAG mode when the sync pulse signal has the initial pulse, the second flip-flop output indicating the default phase;

an XOR logic gate having a first input connected to said second flip-flop output, a second input connected to said first flip-flop output, and an XOR logic gate output, the XOR logic Rate output having a first level if the first flip-flop output and the second flip-flop output match, and having a second level if the first flip-flop output and the second flip-flop output do not match;

a second multiplexer having a first input connected to said first flip-flop output, a select input connected to an acjtagMode line, a second input connected to said XOR logic gate output, and a second multiplexer output;

a third multiplexer having a first input connected to a bscanShiftIn line, a select input connected to a ShiftBscan2Edge line, a second input connected to said second multiplexer output, and a third multiplexer output; and a third flip-flop having a first input connected to said third multiplexer output, a second input connected to a clockBscan line, and a third flip-flop output connected to a bscanShiftOut line.

36. An input AC coupled boundary scan cell (BSC) for receiving a signal, said BSC comprising:

a sampling flip-flop for sampling an input signal in accordance with a reference clock, the input signal being an AC signal if said BSC is in an AC JTAG mode, the sampling flip-flop adapted to capture and output a phase of the AC signal if the input signal is the AC signal;

a feedback flip-flop connected to said sampling flip-flop, said feedback flip-flop adapted to capture a default phase of the AC signal when a sync pulse signal has an initial pulse, an output of said feedback flip-flop indicating the default phase; and an XOR logic connected to the output of said sampling flip-flop and the output of said feedback flip-flop, an output of said XOR logic gate output having a first level if the output of said sampling flip-flop and the output of said feedback flip-flop match, and having a second level if the output of said sampling flip-flop and the output of said feedback flip-flop do not match.

37. The input AC coupled boundary scan cell according to claim 36 further comprising a shifting out flip-flop connected to said multiplexer for processing the signal.

38. The input AC coupled boundary scan cell according to claim 36, further comprising:

a multiplexer coupled to said sampling flip-flop and said XOR logic, said multiplexer adapted to selectively outputting one of the output of said sampling flip-flop and the output of said XOR logic based on a mode select signal.

* * * * *

UNITED STATES PATENT AND TRADEMARK OFFICE
CERTIFICATE OF CORRECTION

PATENT NO. : 6,877,121 B1
DATED : April 5, 2005
INVENTOR(S) : Srinivasaiah et al.

It is certified that error appears in the above-identified patent and that said Letters Patent is hereby corrected as shown below:

<u>Title page,</u>
Item [57], ABSTRACT,
Line 11, after "receiving IC then compares the phase of", replace "a source of" with -- the --.
Line 13, after "phase captured at the", replace "snyc" with -- sync --.

<u>Column 3,</u>
Line 11, replace "VO" with -- I/O --.

<u>Column 6,</u>
Line 7, replace "bscanshiftIn" with -- bscanShiftIn --.
Line 12, replace "BSCS" with -- BSCs. --.

<u>Column 8,</u>
Line 9, replace "Rate" with -- gate --.

<u>Column 9,</u>
Line 29, replace "expect" with -- except --.
Line 54, after "AC", insert -- signal --.
Line 56, replace "method-according" with -- method according --.

<u>Column 13,</u>
Line 3, replace "refclk" with -- refClk --.
Line 12, replace "Rate" with -- gate --.

Signed and Sealed this

Twentieth Day of September, 2005

JON W. DUDAS
*Director of the United States Patent and Trademark Office*